(12) United States Patent
Lin et al.

(10) Patent No.: US 8,602,225 B2
(45) Date of Patent: Dec. 10, 2013

(54) MOUNTING APPARATUS FOR SLIDE RAIL

(75) Inventors: Shu-Chen Lin, New Taipei (TW); Chen-Sheng Tang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 233 days.

(21) Appl. No.: 13/235,449

(22) Filed: Sep. 18, 2011

(65) Prior Publication Data

US 2013/0056432 A1   Mar. 7, 2013

(30) Foreign Application Priority Data

Sep. 5, 2011 (TW) .............................. 100131991 A

(51) Int. Cl.
*A47F 7/00* (2006.01)

(52) U.S. Cl.
USPC ......................................... 211/26; 312/334.4

(58) Field of Classification Search
USPC ........ 211/26, 183, 190, 192, 26.2; 312/334.1, 312/334.4, 319.1; 248/220.21, 220.42, 248/220.22, 201, 298.1
See application file for complete search history.

(56) References Cited

U.S. PATENT DOCUMENTS

| | | | | |
|---|---|---|---|---|
| 6,659,577 | B2 * | 12/2003 | Lauchner ................... | 312/334.5 |
| 6,935,521 | B2 * | 8/2005 | Gundlach et al. ............... | 211/26 |
| 7,093,725 | B2 * | 8/2006 | Hartman et al. ............... | 211/26 |
| 7,357,362 | B2 * | 4/2008 | Yang et al. ............... | 248/221.11 |
| 7,641,297 | B2 * | 1/2010 | Huang ........................ | 312/334.4 |
| 7,798,581 | B2 * | 9/2010 | Chen et al. ..................... | 211/26 |
| 7,798,582 | B2 * | 9/2010 | Yu et al. ..................... | 312/334.4 |
| 7,857,145 | B2 * | 12/2010 | Mushan et al. ................. | 211/26 |
| 7,878,468 | B2 * | 2/2011 | Chen et al. ............... | 248/220.41 |
| 8,235,339 | B2 * | 8/2012 | Selvidge et al. ......... | 248/220.21 |
| 2005/0189855 | A1 * | 9/2005 | Naue et al. ................. | 312/334.4 |
| 2010/0200523 | A1 * | 8/2010 | Henderson ...................... | 211/26 |
| 2012/0018605 | A1 * | 1/2012 | Lacarra .......................... | 211/26 |
| 2012/0132598 | A1 * | 5/2012 | Wang et al. .................... | 211/26 |

* cited by examiner

*Primary Examiner* — Jose V Chen
(74) *Attorney, Agent, or Firm* — Altis Law Group, Inc.

(57) ABSTRACT

A mounting apparatus for fixing a slide rail to either a first rack post or a second rack post with different sizes or shapes of locating holes, includes a mounting bracket secured to the slide rail, a latch member rotatably mounted to the mounting bracket, and a restoring member. The mounting bracket includes a locating pin having a first segment adapted to extending through the first rack post locating hole, and a second segment adapted to extending through the second rack post locating hole. The latch member includes an arm received in the locating pin, with first and second holding teeth. In the locking position, either the first or the second teeth extend out of the locating pin to clasp the first or the second rack post, the unlocking position is achieved against spring pressure.

10 Claims, 6 Drawing Sheets

MOUNTING APPARATUS FOR SLIDE RAIL

CROSS-REFERENCE OF RELATED APPLICATION

Relevant subject matter is disclosed in a pending U.S. patent application, titled "MOUNTING APPARATUS FOR SLIDE RAIL," with the application Ser. No. 13/151,286 and filed on Jun. 2, 2011, which is assigned to the same assignee as this patent application.

BACKGROUND

1. Technical Field

The present disclosure relates to mounting apparatuses and, more particularly, to an apparatus for mounting a slide rail.

2. Description of the Related Art

Traditionally, a slide rail provides movement between two objects such as a desk and a drawer, or a server and a rack.

Many slide rail assemblies, for instance, for a desk drawer, include an outer slide rail mounted to the desk, an inner slide rail mounted to the drawer, and an intermediate slide rail mounted between the outer and inner slide rails. The intermediate slide rail can move inside the outer slide rail, and also move along the inner slide rail, thus the drawer can be pulled out from the desk. Screws are used for mounting the outer slide rail to the desk, and the positioning and fixing of the outer slide rail is inconvenient and time-consuming.

DETAILED DESCRIPTION

Figure 4:
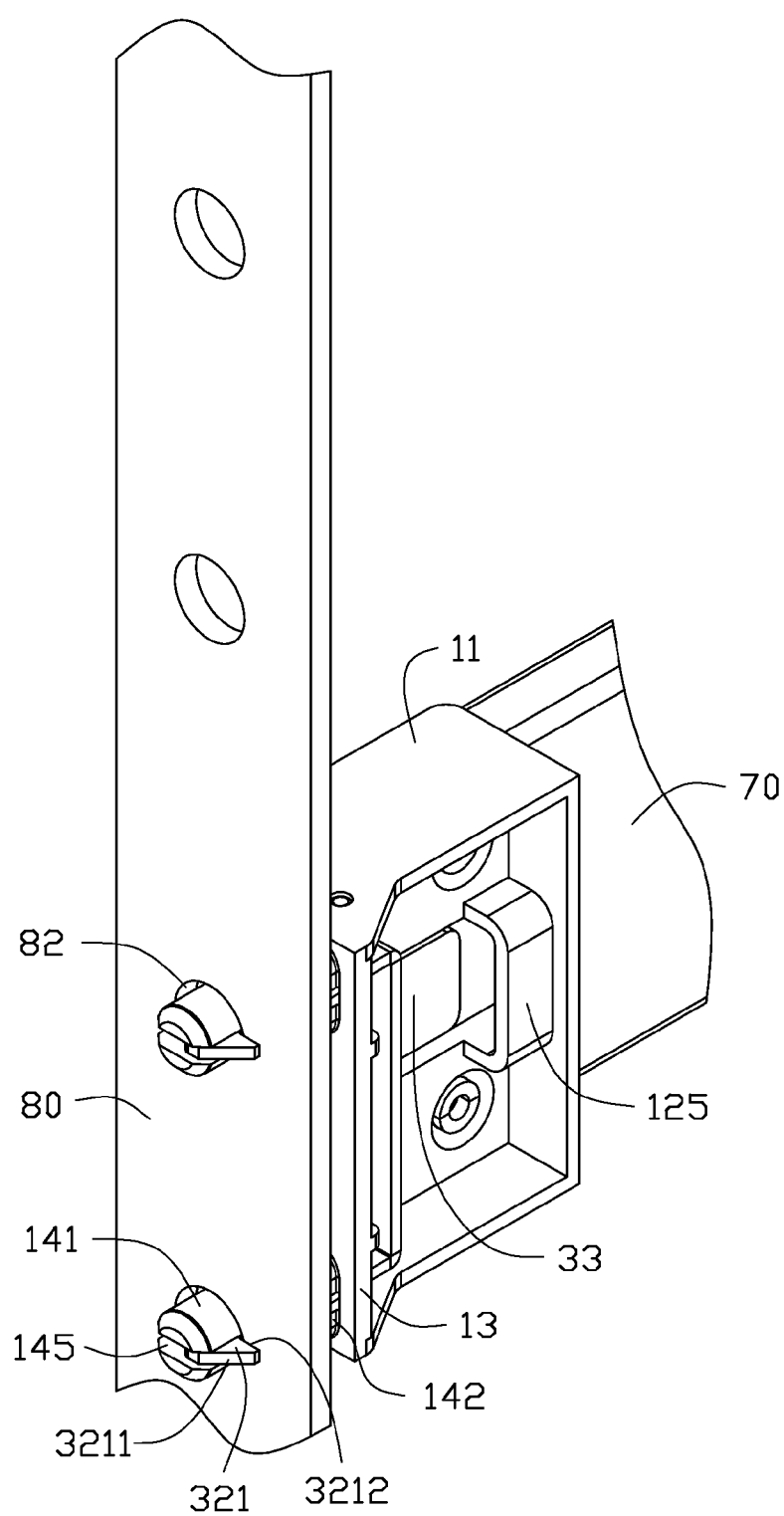
FIGS. 4 and 5 show the slide rail of FIG. 3 attached to a first rack post, and the latch member respectively in the locked and unlocked positions.
Figure 6:
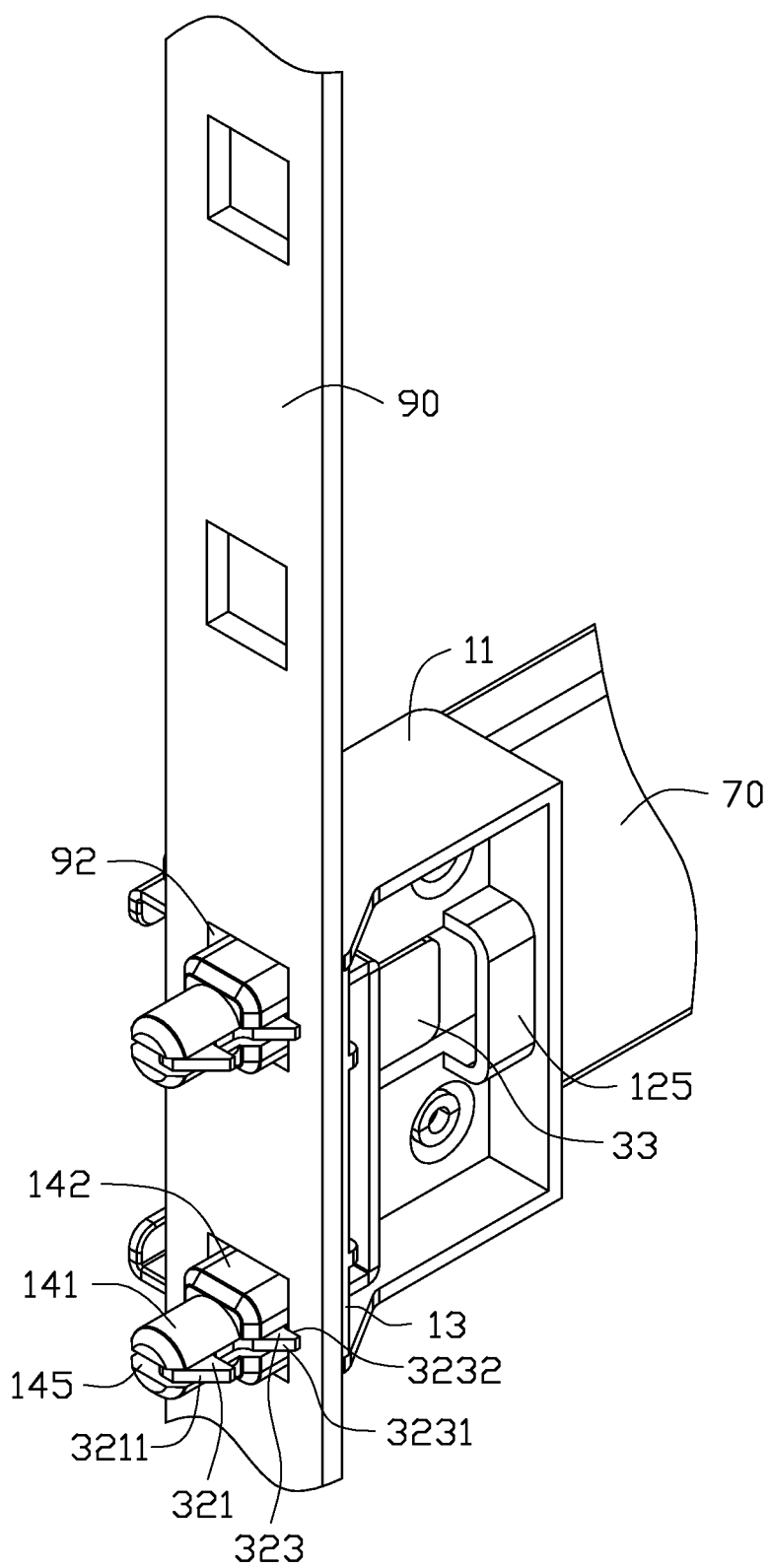
FIG. 6 shows the slide rail of FIG. 3 attached to a second rack post.

Referring to FIGS. 4 and 6, an embodiment of a mounting apparatus may be used for retaining a slide rail 70 to a first rack post 80 defining a plurality of round locating holes 82, or to a second rack post 90 defining a plurality of square locating holes 92. The diameter of each of the locating holes 82 is less than the length of a diagonal line across each of the locating holes 92.

Figure 1:
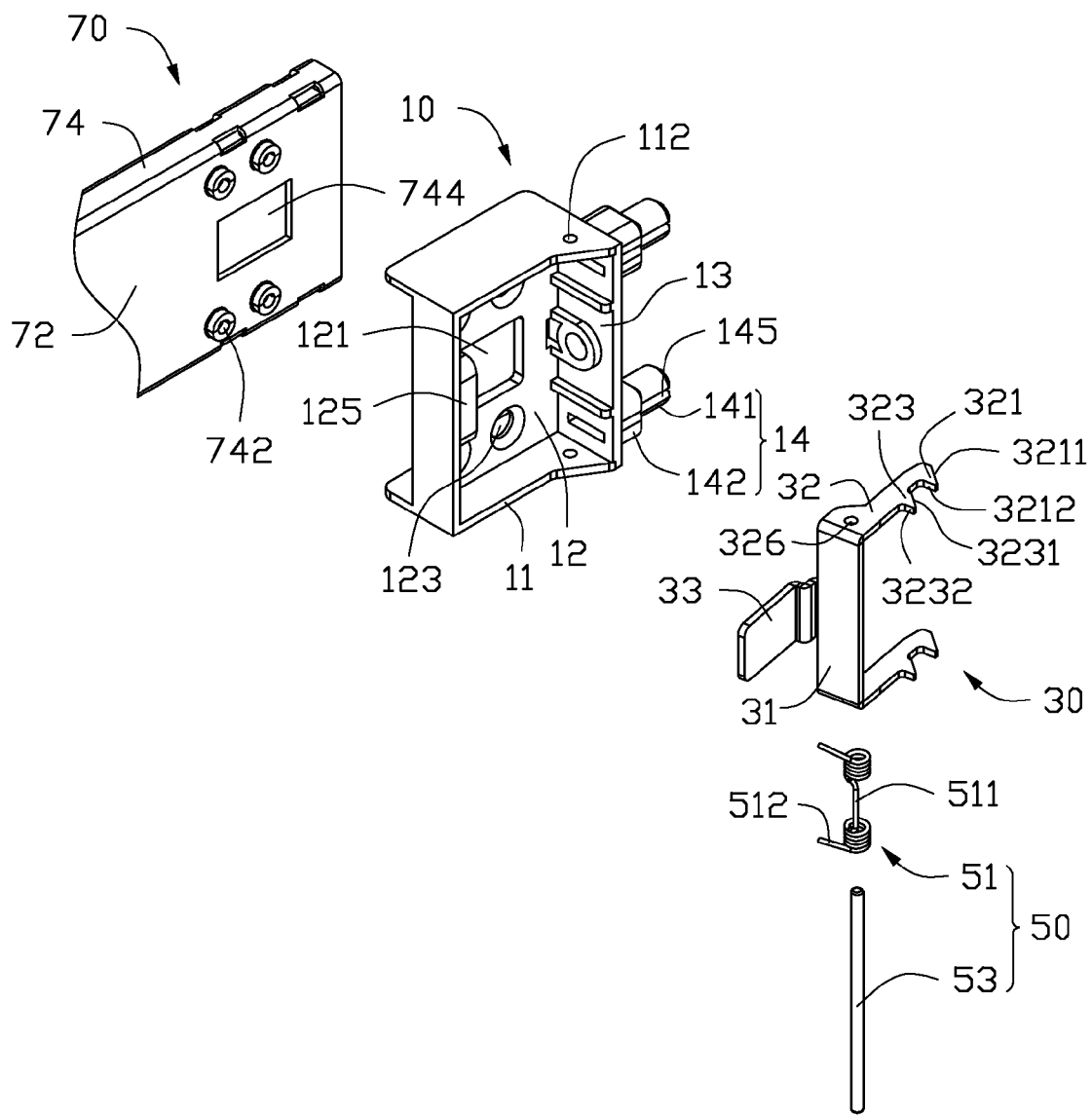
FIGS. 1 and 2 are exploded, isometric views of an embodiment of a mounting apparatus and a slide rail, from different perspectives.
Figure 2:
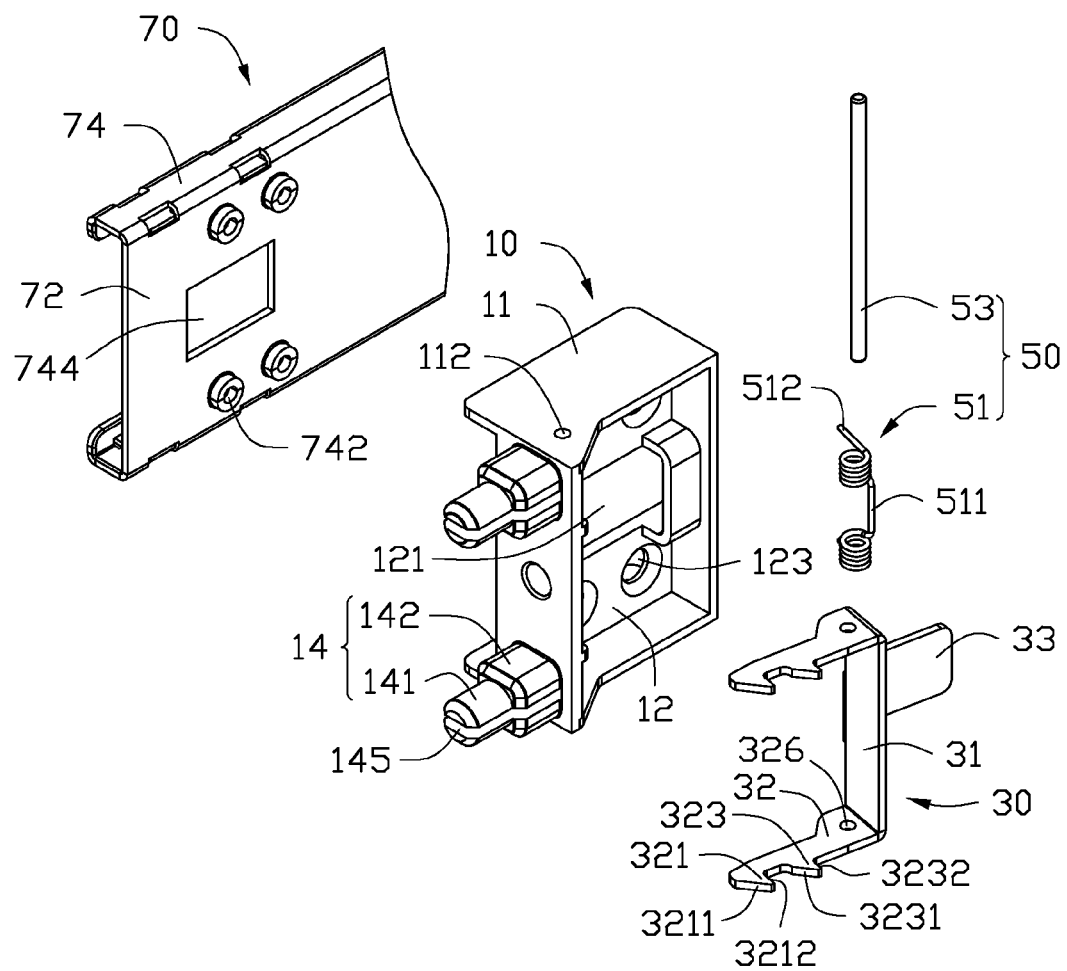

Referring to FIGS. 1 and 2, the mounting apparatus includes a mounting bracket 10, a latch member 30, and a restoring member 50.

The slide rail 70 includes a web 72 with two flanges 74 extending from the top and bottom of the web 72. A plurality of bosses 742 protrudes from an outer surface of the web 72. An opening 744 is defined in the web 72 between the topmost and bottommost of the bosses 742.

The mounting bracket 10 includes two parallel supporting boards 11, a base board 12 perpendicularly connected between the support boards 11, and an end plate 13 perpendicularly extending outwards from the front end of the base board 12 and connecting the supporting boards 11. Each of the supporting boards 11 defines a securing hole 112 adjacent to the end plate 13. The base board 12 defines a plurality of fixing holes 123, and a access hole 121 for fingertip access arranged among the fixing holes 123. A limiting portion 125 protrudes from the outer side of the base board 12, adjacent to the rear end of the base board 12. Two locating pins 14 perpendicularly extend forwards from the end plate 13. Each of the locating pins 14 includes a first segment 141, and a second segment 142 arranged between a rear end of the first segment 141 and the end plate 13. A shoulder is formed between the first and second segments 141 and 142 of each of the locating pins 14. The first segment 141 is a cylindrical column fit with the locating holes 82, for example, with a diameter slightly smaller than the diameter of each of the locating holes 82 of the first rack post 80. The second segment 142 is a column with a square cross section, where the length of a diagonal line across the square is greater than the diameter of each of the locating holes 82 of the first rack post 80, but fit with the locating holes 92, for example, slightly smaller than the length of a diagonal line across each of the locating holes 92. Therefore, the first segment 141 can extend through any of the locating holes 82 of the first rack post 80. The second segment 142 can extend through any of the locating holes 92 of the second rack post 90, but cannot extend into any of the locating holes 82 of the first rack post 80. Each of the locating pins 14 is diametrically and symmetrically divided so as to define a receiving slot 145 which extends through the end plate 13, the slots 145 being parallel to the supporting boards 11.

The latch member 30 includes a middle portion 31, two arms 32 respectively extending forwards from opposite ends of the middle portion 31, and a manipulation portion 33 extending rearwards from the middle portion 31. A first tooth 321 and a second tooth 323 extend from the same side of each of the arms 32. The first tooth 321 is arranged in front of the second tooth 323. Each of the first teeth 321 forms a guide slope 3211 facing forwards, and a stop side 3212 facing the middle portion 31, and the shape of each of the second teeth 323 is substantially similar to that of the first teeth. Each of the arms 32 defines a pivot hole 326, in close proximity to the middle portion 31.

The restoring member 50 includes a resilient member 51, and a pivot shaft 53. The resilient member 51 includes a double-sided torque spring, with a flat connecting arm (first torque arm 511) in the middle, and two second torque arms 512 extending from the two outer ends of the two coils.

Figure 3:
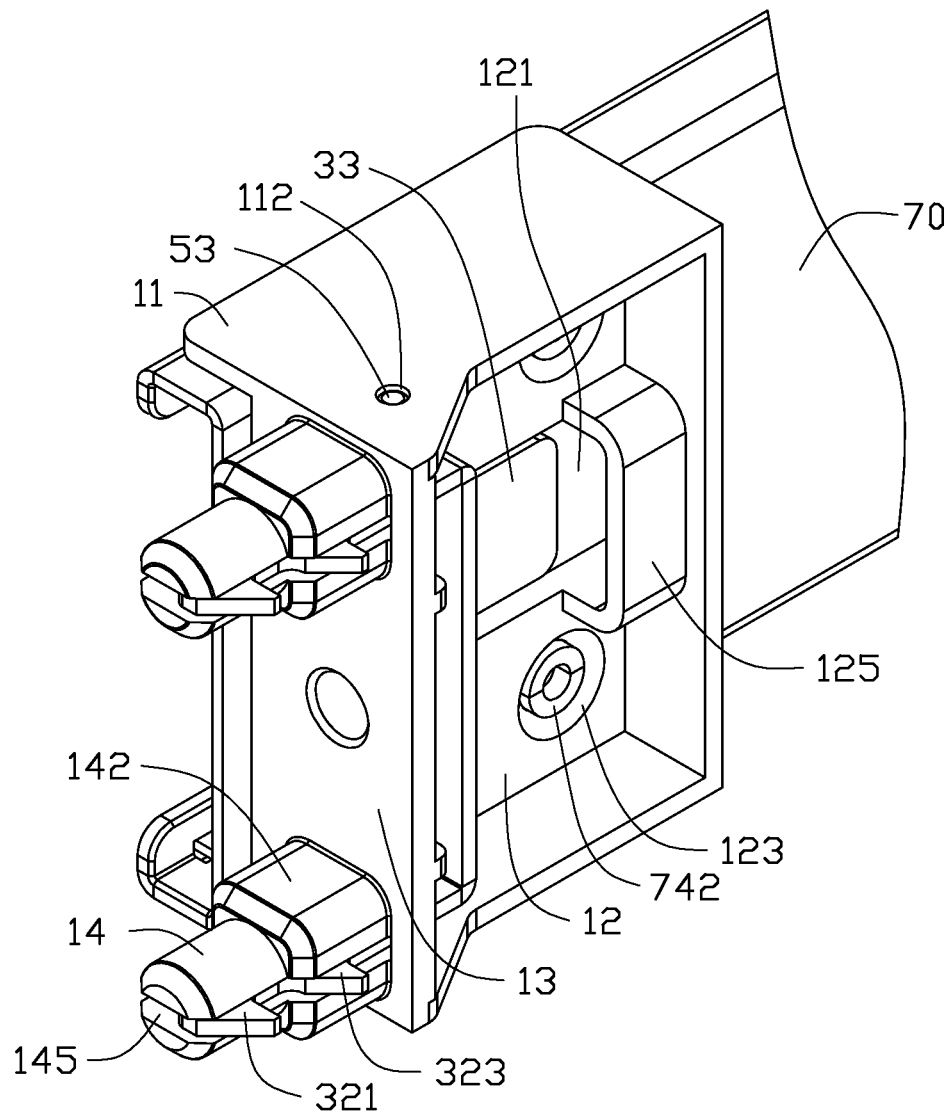
FIG. 3 is a view of the assembled device of FIG. 2.

Referring to FIG. 3, in assembly, the latch member 30 is received between the supporting boards 11 of the mounting bracket 10. The arms 32 of the latch member 30 extend into the receiving slots 145 of the locating pins 14 with the teeth 321 and 323 pointing away from the base board 12. The manipulation portion 33 of the latch member 30 is disposed between the limiting portion 125 and the base board 12 of the mounting bracket 10, and is accessible to a human fingertip through the access hole 121 of the base 12 of the mounting bracket 10. The pivot holes 326 of the arms 32 of the latch member 30 align with the securing holes 112 of the corresponding supporting boards 11 of the mounting bracket 10. The resilient member 51 is inserted between the arms 32 of the latch member 30, with the first torque arm 511 abutting the middle portion 31 of the latch member 30 in the manner of a saddle, and the second torque arms 512 resisting against the base board 12 of the mounting bracket 10. The pivot shaft 53 extends axially through the resilient member 51 and the pivot holes 326 of the arms 32 of the latch member 30. The ends of the pivot shaft 53 are fixed in the securing holes 112 of the supporting boards 11, to rotatably mount the latch member 30 to the mounting bracket 10. The resilient member 51 exerts a constant force on the latch member 30, to make the first and second teeth 321 and 323 of the arms 32 extend outside the locating pins 14 through the receiving slots 145.

The mounting apparatus is installed to the slide rail 70, with the bosses 742 of the slide rail 70 meeting the corresponding fixing holes 123 of the mounting bracket 10. The manipulation portion 33 of the latch member 30 is aligned with the opening 744 of the slide rail 70.

Referring to FIG. 4, to mount the slide rail 70 to the first rack post 80, the first segments 141 of the locating pins 14 are pressed into two corresponding locating holes 82 of the first rack post 80, from the rear side of the first rack post 80. The guide slopes 3211 of the first teeth 321 of the latch member 30 enable the retraction against spring pressure of the first teeth 321 during entry into the locating holes 82, to pivot the latch member 30. When the first teeth 321 emerge through the front surface of the first rack post 80, the resilient member 51 causes the latch member 30 to pivot to a locking position, where the first and second teeth 321 and 323 of the latch member 30 extend out of the receiving slots 145 of the corresponding locating pins 14 to sandwich the first rack post 80 between the stop sides 3212 of the first teeth 321 of the latch member 30 and the shoulders of the second segments 142 of the locating pins 14. Therefore, the slide rail 70 is retained to the first rack post 80.

Figure 5:
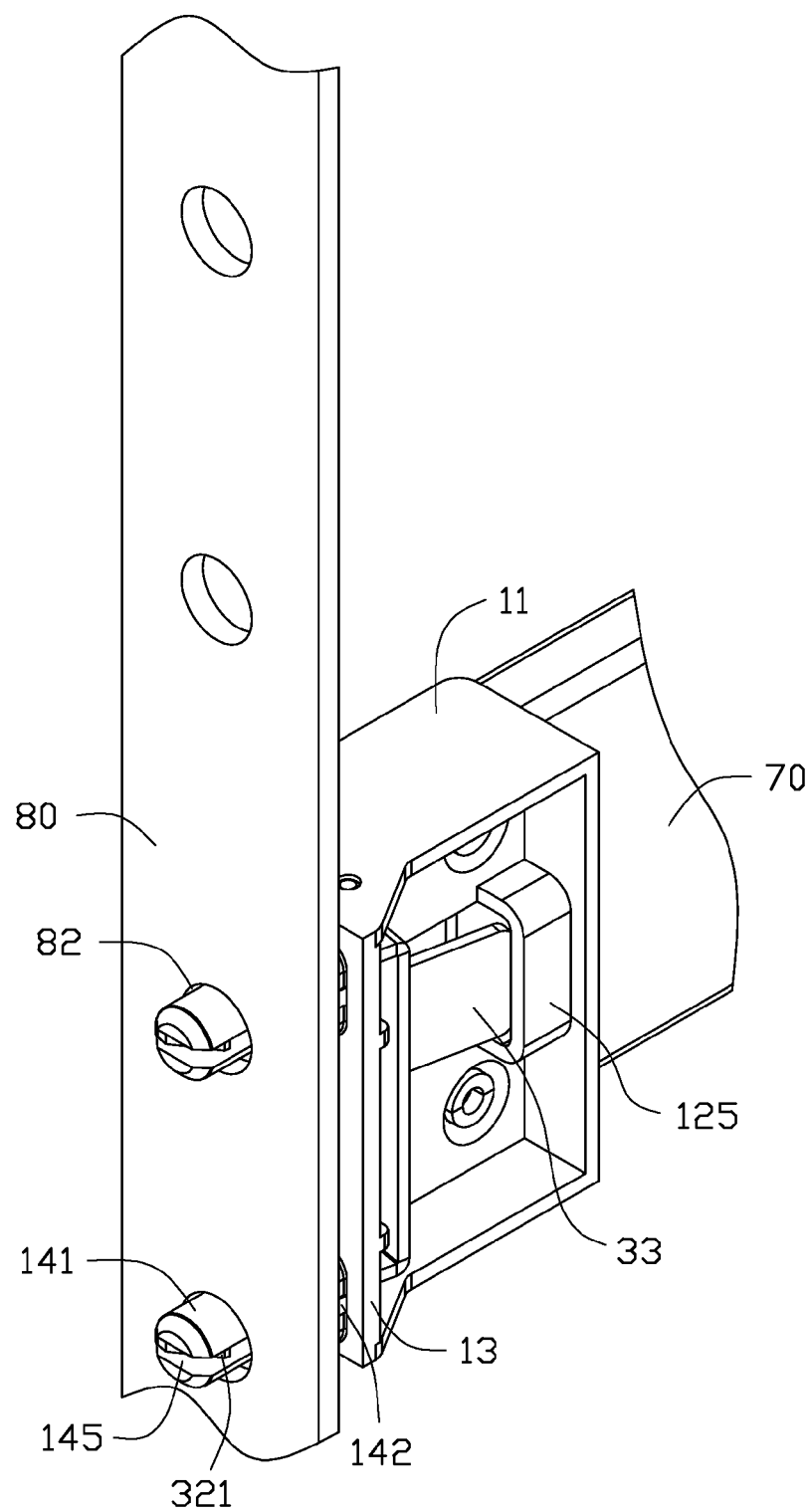

Referring to FIG. 5, the detachment of the slide rail 70 from the first rack post 80 requires finger pressure on the manipulation portion 33 of the latch member 30, to pivot the latch member 30 against spring pressure of the resilient member 51 to an unlocking position, where the first and second teeth 321 and 323 of the latch member 30 are retracted into the receiving slots 145 of the corresponding locating pins 14. Therefore, the first teeth 321 of the latch member 30 disengage from the first rack post 80 to enable the locating pins 14 to be withdrawn from the corresponding locating holes 82 of the first rack post 80, and the slide rail 70 can be detached from the first rack post 80.

Referring to FIG. 6, to mount the slide rail 70 to the second rack post 90, the locating pins 14 are pressed into the locating holes 92 of the second rack post 90 from the rear side of the second rack post 90, until the end plate 13 of the mounting bracket 10 abuts the second rack post 90, following a procedure which is similar to that in mounting the slide rail 70 to the first rack post 80. The second rack post 90 is sandwiched between the stop sides 3232 of the second teeth 323 of the latch member 30 and the end plate 13 of the mounting bracket 10. Therefore, the slide rail 70 is retained to the second rack post 90.

Even though numerous characteristics and advantages of the embodiment(s) have been set forth in the foregoing description, together with details of the structures and functions of the embodiment(s), the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A mounting apparatus for mounting a slide rail to either a first rack post or a second rack post with different sized locating holes, the mounting apparatus comprising:
   a mounting bracket secured to the slide rail, and comprising an end plate and a locating pin perpendicularly extending forwards from the end plate, the locating pin comprising a first segment to extend through one of the locating holes of the first rack post, and a second segment connected between the end plate and the first segment to extend through one of the locating holes of the second rack post, but unable to extend into the locating holes of the first rack post, the locating pin defining a receiving slot extending through the end plate;
   a latch member pivotably mounted to the mounting bracket, and comprising a middle portion and an arm extending from the middle portion into the receiving slot, a first tooth and the a second tooth protruding from a side of the arm, and correspondingly aligned with the first and second segments of the locating pin, wherein the latch member is rotatable between a locking position, where the first and second teeth of the arm extend out of the receiving slot of the locating pin, thereby sandwiching the first rack post between the first tooth of the arm and the second segment of the locating pin, or sandwiching the second rack post between the second tooth of the arm and the end plate of the mounting bracket, and an unlocking position, where the first and second teeth of the arm are withdrawn into the receiving slot of the locating pin; and
   a restoring member connected between the latch member and the mounting bracket, the restoring member comprising a resilient member resisting against the mounting bracket and the latch member, to bias the latch member to the locking position.

2. The mounting apparatus of claim 1, wherein the restoring member further comprises a pivot shaft pivotably extends through the latch member and is fixed to the mounting bracket.

3. The mounting apparatus of claim 2, wherein the arm of the latch member defines a pivot hole adjacent to the middle portion, the pivot shaft pivotally extends through the pivot hole of the arm of the latch member.

4. The mounting apparatus of claim 2, wherein the mounting bracket further comprises a base board abutting against the slide rail and perpendicular to the end plate, the resilient member comprises at least one torque spring placed around the pivot shaft, a first torque arm resisting against the middle portion of the latch member, and a second torque arm resisting against the base board of the mounting bracket.

5. The mounting apparatus of claim 4, wherein the latch member further comprises a manipulation portion extending from the middle portion, opposite to the arm, the mounting bracket defines an access hole, through which the manipulation portion of the latch member is accessible.

6. The mounting apparatus of claim 4, wherein the mounting bracket comprises an arch-shaped limiting portion protruding from the base board of the mounting bracket, the manipulation portion extends between the limiting portion and the base board of the mounting bracket.

7. The mounting apparatus of claim 1, wherein each of the first and second teeth of the latch member forms a guiding slope facing forwards, the first and second teeth are forced into the receiving slot of the locating pin in response to the guiding slopes of the corresponding first and second teeth engagingly slide through the rack post.

8. An assembly comprising:
   a slide rail;
   a rack post defining a locating hole;
   a mounting bracket secured to the slide rail, and comprising an end plate and a locating pin perpendicularly extending forwards from the end plate into the locating hole, the locating pin comprising a first segment and a second segment connected between the end plate and the first segment, the first and the second segments being of different sizes, and either one of them fit with and extending through the locating hole, the locating pin defining a receiving slot extending through the end plate;

a latch member pivotably mounted to the mounting bracket, and comprising a middle portion and an arm extending from the middle portion into the receiving slot, a first tooth and the a second tooth protruding from a side of the arm, and correspondingly aligned with the first and second segments of the locating pin, wherein the latch member is rotatable between a locking position, where the first and second teeth of the arm extend out of the receiving slot of the locating pin, thereby sandwiching the first rack post between the first tooth of the arm and the second segment of the locating pin, or sandwiching the second rack post between the second tooth of the arm and the end plate of the mounting bracket, and an unlocking position, where the first and second teeth of the arm are withdrawn into the receiving slot of the locating pin; and a restoring member connected between the latch member and the mounting bracket, the restoring member comprising a resilient member resisting against the mounting bracket and the latch member, to bias the latch member to the locking position.

9. The assembly of claim 8, wherein the locating hole is round, the first segment of the locating pin is a cylindrical column fit with the locating hole, with a diameter slightly smaller than the diameter of the first locating hole.

10. The assembly of claim 8, wherein the locating hole is rectangular, the second segment of the locating pin is a column defining a square cross section fit with the locating hole, with a length of a diagonal greater than a size of the first segment, and slightly less than the length of a diagonal of the locating hole.

* * * * *